United States Patent
Kim et al.

(10) Patent No.: US 8,874,064 B2
(45) Date of Patent: Oct. 28, 2014

(54) ULTRAHIGH FREQUENCY I/Q SENDER/RECEIVER USING MULTI-STAGE HARMONIC MIXER

(75) Inventors: Ki Jin Kim, Gwangju (KR); Kwang Ho Ahn, Yongin (KR); Sanghoon Park, Seoul (KR)

(73) Assignee: Korea Electronics Technology Institute, Seongnam-Si, Gyeonggi-Do (KR)

( * ) Notice: Subject to any disclaimer, the term of this patent is extended or adjusted under 35 U.S.C. 154(b) by 166 days.

(21) Appl. No.: 13/325,722

(22) Filed: Dec. 14, 2011

(65) Prior Publication Data

US 2012/0163493 A1   Jun. 28, 2012

(30) Foreign Application Priority Data

Dec. 24, 2010   (KR) .......................... 10-2010-0134877

(51) Int. Cl.
*H04B 15/00*   (2006.01)
*H03D 7/16*   (2006.01)

(52) U.S. Cl.
CPC ............... *H03D 7/163* (2013.01); *H03D 7/165* (2013.01)
USPC .......................................... 455/314; 455/318

(58) Field of Classification Search
USPC ............................... 455/189.1, 311–319, 324
See application file for complete search history.

(56) References Cited

U.S. PATENT DOCUMENTS

| | | | | |
|---|---|---|---|---|
| 3,939,424 A | * | 2/1976 | Shimizu et al. | ............... 455/265 |
| 2004/0257478 A1 | | 12/2004 | Su | |
| 2004/0257479 A1 | * | 12/2004 | Su | ................. 348/731 |
| 2009/0156155 A1 | * | 6/2009 | Krug et al. | .................... 455/313 |

* cited by examiner

*Primary Examiner* — Christian Hannon
(74) *Attorney, Agent, or Firm* — Lowe Hauptman & Ham, LLP

(57) ABSTRACT

A receiver using a harmonic mixer includes a signal receiver for receiving a first signal, a frequency generator for synchronizing a phase of the received first signal, down-converting a frequency size of the synchronized first signal as much as a first size, and outputting the down-converted signal as a second signal; a first harmonic mixer unit for receiving the first signal and the second signal, generating a third signal having a frequency size down-converted as much as a second size, and outputting the third signal. The receiver further includes a second harmonic mixer unit for receiving the third signal and outputting an In-phase signal having a frequency size down-converted as much as a third size, and a third harmonic mixer unit for receiving the third signal and outputting a Quadrature-phase signal having a frequency size down-converted as much as a third size.

8 Claims, 7 Drawing Sheets

ULTRAHIGH FREQUENCY I/Q SENDER/RECEIVER USING MULTI-STAGE HARMONIC MIXER

CROSS-REFERENCE TO RELATED APPLICATION

This application claims priority to and the benefit of Korean Patent Application No. 10-2010-0134877 filed in the Korean Intellectual Property Office on Dec. 24, 2010, the entire contents of which are incorporated herein by reference.

BACKGROUND OF THE INVENTION (a) Field of the Invention

The present invention relates to an ultrahigh frequency In-phase/Quadrature-phase (I/Q) transmitter/receiver using a multi-stage harmonic mixer.

(b) Description of the Related Art

A typical In-phase/Quadrature-phase (I/Q) receiver includes a direct conversion receiver and a receiver using a harmonic mixer. The structure of the receiver will be described in detail with reference to FIGS. 1 and 2.

FIG. 1 is a configuration diagram that illustrates a typical direct conversion receiver.

Referring to FIG. 1, the direct conversion receiver includes a voltage controlled oscillator (VCO) and a phase looked loop (PLL). The PLL stabilizes the VCO, and the VCO oscillates a frequency. The frequency output from the VOC may be same to an input signal (RFin) of the direct conversion receiver or may be different from the input signal (RFin) as much as an intermediate frequency.

The direct conversion receiver has a structure that down-converts a frequency signal, which is different from the input frequency as much as the VCO frequency, to an I-path and a Q-path when the output frequency of the VCO is applied to a mixer after passing through a circuit for dividing a signal to I/Q.

The direct conversion receiver may be realized with simple blocks if the VCO frequency is generated to be equal or similar to the input signal.

However, it is very difficult to design a super high frequency PLL of a super high frequency integrated circuit (IC) for generating a high frequency like a super high frequency input signal or for stabilizing the generated high frequency. The direct conversion receiver of FIG. 1 is not proper for such a super high frequency integrated circuit. Furthermore, the direct conversion receiver of FIG. 1 has characteristic that the phase noise of the oscillator becomes deteriorated quickly as a frequency of the oscillator increases. Accordingly, the direct conversion receiver of FIG. 1, which uses a high frequency oscillator, is not proper from a noise point of view.

FIG. 2 is a configuration diagram that illustrates a receiver using a harmonic mixer.

Unlike the direct conversion receiver of FIG. 1, a Vlo frequency becomes a half a RFin frequency in a receiver including a harmonic mixer, as shown in FIG. 2. Accordingly, frequency generation is comparatively easier. Furthermore, the receiver using the harmonic mixer has a structure reducing a phase noise.

However, in order to design an I/Q structure of FIG. 2, a 45° generator is required. It is not easy to accurately generate 45° phase frequencies from the Vlo frequency. As a result, a noise is generated in the receiver.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an ultrahigh frequency I/Q transmitter and receiver using a multi-stage harmonic mixer having advantages of easily perform I/Q conversion while reducing a phase noise through reducing an oscillation frequency.

An exemplary embodiment of the present invention provides a receiver using a harmonic mixer.

The receiver includes a signal receiver for receiving a first signal, a frequency generator for synchronizing a phase of the received first signal, converting a frequency size (i.e., "a frequency size" indicates "a size of a frequency range") of the synchronized first signal to a first size, and outputting the converted signal as a second signal, a first harmonic mixer unit for receiving the first signal and the second signal, generating, based on the first signal and the second signal, a third signal having a frequency size converted to a second size, and outputting the third signal, a second harmonic mixer unit for receiving the third signal and outputting, based on the third signal, an In-phase signal having a frequency size converted to a third size, and a third harmonic mixer unit for receiving the third signal and outputting, based on the third signal, a Quadrature-phase signal having a frequency size converted to a third size.

Another exemplary embodiment of the present invention provides a transmitter using a harmonic mixer.

The transmitter includes a first harmonic mixer unit for generating a first signal having a second frequency size by up-converting an In-phase signal having a first frequency size, a second harmonic mixer unit for generating a second signal having a second frequency size by up-converting a Quadrature-phase signal having a first frequency, a third harmonic mixer unit for receiving the first and second signals and generating a third signal having a second frequency size, and a signal transmitter for amplifying and transmitting the third signal.

According to an exemplary embodiment of the present invention, a local frequency having a low phase noise can be easily generated using a multi-stage harmonic mixer, and an I/Q MODEM can be easily realized. Furthermore, an overall power consumption of an entire transmitting/receiving system can be reduced because an oscillation frequency is reduced, and an I/Q MEDOM can be easily generated.

DETAILED DESCRIPTION OF THE EMBODIMENTS

Figure 1:
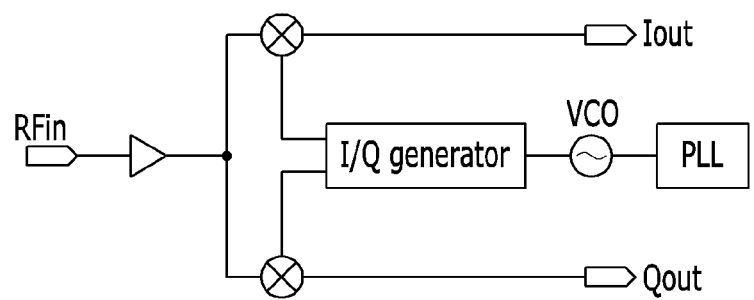
FIG. 1 is a configuration diagram that illustrates a typical direct conversion receiver.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

Throughout the specification, in addition, unless explicitly described to the contrary, the word "comprise" and variations such as "comprises" or "comprising", will be understood to imply the inclusion of stated elements but not the exclusion of any other elements.

An ultrahigh frequency I/Q transmitting and receiving system using a multi-stage harmonic mixer in accordance with an embodiment of the present invention will be described with reference to the accompanying drawings.

Figure 3:
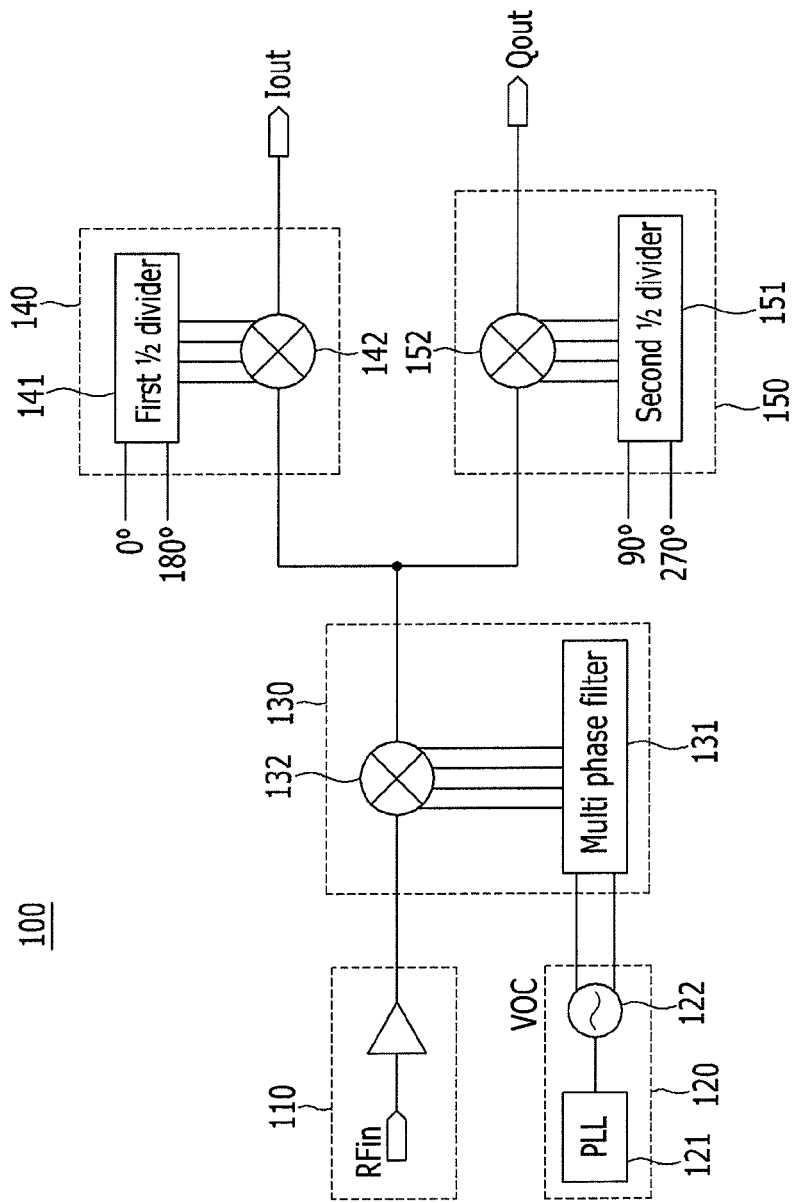
FIG. 3 is a configuration diagram that illustrates a receiver using a multi-stage harmonic mixer, in accordance with an exemplary embodiment of the present invention.

FIG. 3 is a configuration diagram that illustrates a receiver using a multi-stage harmonic mixer, in accordance with an exemplary embodiment of the present invention.

As shown in FIG. 3, the receiver 100 in accordance with an exemplary embodiment of the present invention includes a signal receiving unit 110, a frequency generator 120, and a plurality of harmonic mixer units. In accordance with an exemplary embodiment of the present invention, the receiver 100 includes a first harmonic mixer unit 130, a second harmonic mixer unit 140, and a third harmonic mixer unit 150 as the plurality of harmonic mixer units. However, the present invention is not limited thereto.

The signal receiving unit 110 receives a signal, amplifies the received signal, and outputs the amplified signal. The amplified signal inputs to the first harmonic mixer unit 130.

The frequency generator 120 generates a frequency of a VCO stabilized by a PLL and outputs the frequency. The output frequency inputs to the first harmonic mixer unit 130. The frequency generator 120 includes a phase locked loop 121 and an oscillator 122.

The phase locked loop 121 synchronizes a phase of a signal received from the signal receiving unit 110. The oscillator 122 converts a frequency size of a signal input to the signal receiving unit 110 by ⅓.

The first harmonic mixer unit 130 receives the input signal of the signal receiving unit 110 and the output signal of the frequency generator 120 and generates a signal having four phases and a frequency size equal to ⅓ of an input signal frequency. Such a first harmonic mixer unit 130 includes a first harmonic mixer 132 and a multi-phase filter 131.

The first harmonic mixer 132 receives an input signal from the signal receiving unit 110. The multi-phase filter 131 receives an output frequency signal of the frequency generator 120 and outputs four phases for the output frequency signal received from the frequency generator 120.

The harmonic mixer obtains four phases of 0°, 90°, 180°, and 270° as a local signal of a mixer. That is, the harmonic mixer reduces a frequency of an input signal by combining the four input phases. That is, in order to convert a frequency of an input signal (RFin), a local input of the harmonic mixer can be used as a frequency corresponding to RFin/2. The harmonic mixer is used to remove a time-variable DC offset and to prevent a VCO from pulling by a power amplifier because the harmonic mixer makes an input frequency of the mixer to be different from the local frequency.

For example, when a frequency size (i.e., "a frequency size" indicates "a size of a frequency range") of an input signal is 60 MHz, the receiver 100 performs following operations to make an output of 0 MHz. The receiver 100 in accordance with an exemplary embodiment of the present invention includes two-stage mixer. When the receiver 100 uses dual conversion, the first harmonic mixer unit 130 having a first stage mixer outputs a signal having a frequency size of 20 MHz and the second harmonic mixer unit 140 and the third harmonic mixer unit 150 each having a second stage mixer outputs a signal having a frequency size of 0 MHz.

However, in an exemplary embodiment of the present disclosure, since the first harmonic mixer 132 of the first harmonic mixer unit 130 is a harmonic mixer, the first harmonic mixer unit 130 outputs a signal having a frequency size of 20 MHz by using a signal of 20 MHz input from the frequency generator 120, which is a half a frequency size of 40 MHz. In other words, if the first harmonic mixer unit 130 receives an input signal having a frequency size of 60 MHz, the first harmonic mixer unit 130 outputs a signal having a frequency size of 20 MHz by using the input signal of 60 MHz and ⅓ (i.e., 20 MHz) of the input signal of 60 MHz input from the frequency generator 120 (i.e., 60 MHz-2×20 MHz=20 MHz). Accordingly, the first harmonic mixer unit 130 finally outputs a signal having a frequency size equal to ⅓ of the frequency size of the input signal.

Therefore, the frequency generator 120 synchronizes a phase so that the first harmonic mixer unit 130 can reduce a frequency size of an input signal by ⅓ by converting a frequency size of an input signal by ⅓. The second harmonic mixer unit 140 and the third harmonic mixer unit 150 respectively output signals (i.e., an In-phase signal and Quadrature-phase signal) by using a signal having a frequency size equal to ⅙ of a frequency size of an initial input signal (e.g., when the initial input signal is 60 MHz, the first harmonic mixer unit 130 outputs a signal of 20 MHz which acts as another input signal to each of the second harmonic mixer unit 140 and the third harmonic mixer unit 150. Then, to the second harmonic mixer unit 140 and the third harmonic mixer unit 150 respectively output a signal of 0 MHz by using the another input signal of 20 MHz and ⅙ (i.e., 10 MHz) of the initial input signal of 60 MHz (i.e., 20 MHz-2×10 MHz=0 MHz).

Meanwhile, the multi-phase filter 131 will be described with reference to FIG. 5 and FIG. 6.

Figure 5:
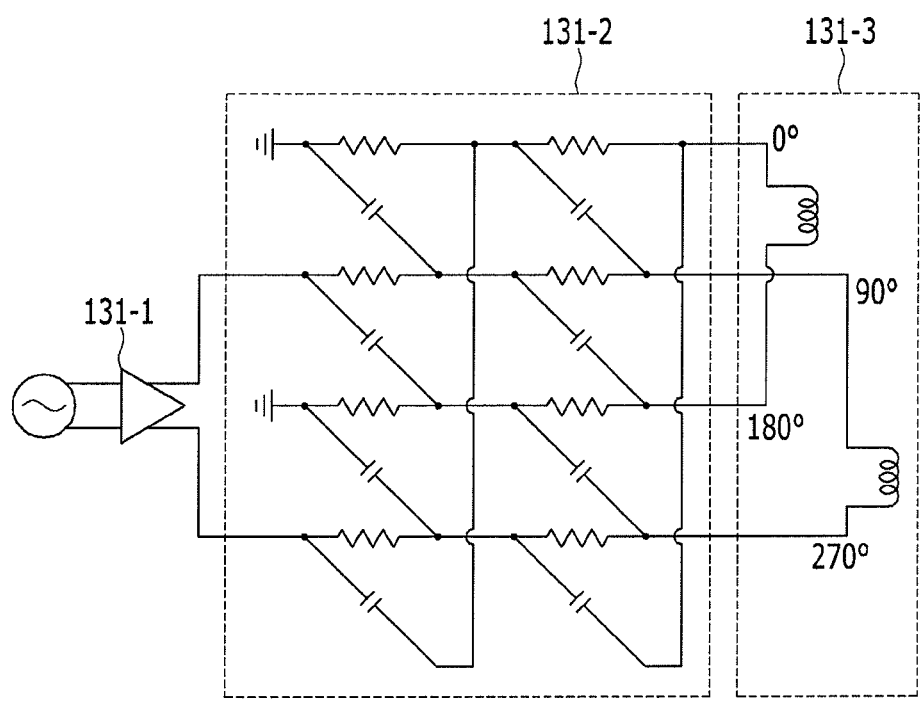
FIG. 5 is a configuration diagram that illustrates a multi-phase filter in accordance with an exemplary embodiment of the present invention.
Figure 6:
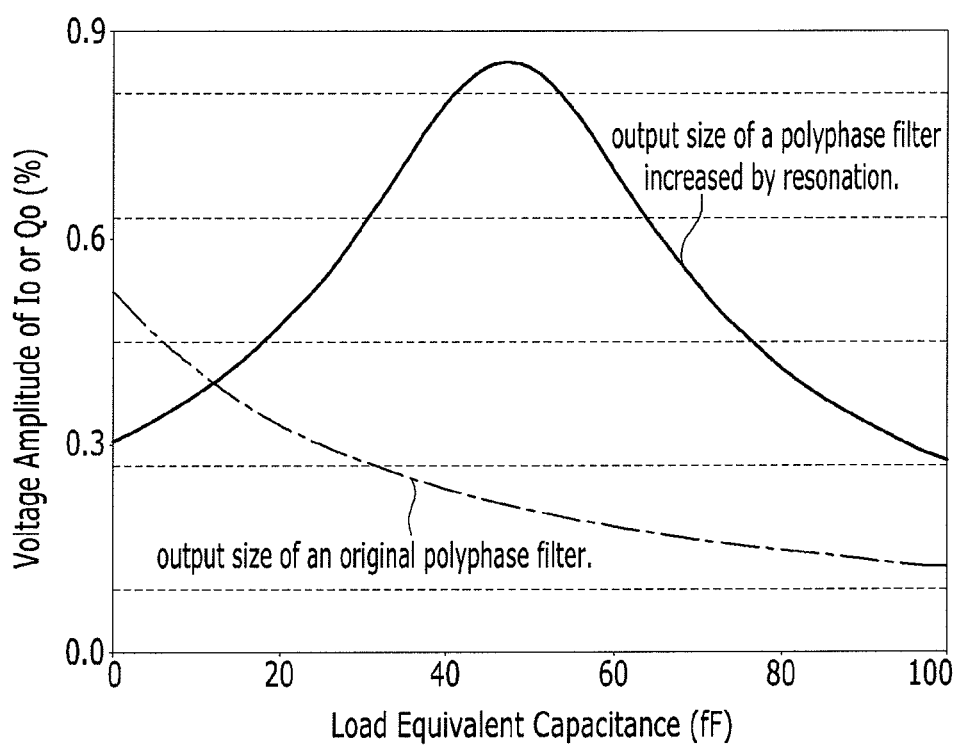
FIG. 6 is a graph illustrating characteristics of a multi-phase filter in accordance with an exemplary embodiment of the present invention.

FIG. 5 is a configuration diagram that illustrates a multi-phase filter in accordance with an exemplary embodiment of the present invention, and FIG. 6 is a graph illustrating characteristics of a multi-phase filter in accordance with an exemplary embodiment of the present invention.

As shown in FIG. 5, a multi-phase filter 131 realizes a phase difference of 90. Since the first harmonic mixer 132 requires an input having four phases, the multi-phase filter 131 is located at an output end of the frequency generator 120. The multi-phase filter 131 generates four phases and provides the four phases to the first harmonic mixer 132.

In accordance with an embodiment of the present invention, the multi-phase filter 131 includes two input terminals and four output terminals. Signals from two input terminals are amplified at the amplifier 131-1, and the amplified signals are input to the phase generator 131-2. The phase generator 131-2 generates four phase having a phase difference of 90° with two grounds. Since a method of generating four phases through two input terminals and two grounds at the phase generator 131-2 is widely known, detailed description thereof will be omitted herein.

Since the multi-phase filter 131 is a passive element, the output of the multi-phase filter is significantly attenuated compared to the input signal. In order to prevent such attenuation, the generated phase is resonated by disposing an inductor 131-3 at an output end of the multi-phase filter 131 in accordance with an exemplary embodiment of the present invention. The characteristics of the multi-phase filter including the inductor 131-3 is shown in FIG. 6.

As shown in FIG. 6, a typical multi-phase filter not including a resonator passes only 20% of an input signal as output. On the contrary, the multi-phase filter including the inductor 131-3 in accordance with an exemplary embodiment of the present invention transmits about 90% voltage of an input signal.

Meanwhile, the second harmonic mixer unit 140 and the third harmonic mixer unit 150 of FIG. 3 receive the output of the first harmonic mixer unit 130, which is a signal having a frequency size equal to ⅓ of the input signal. The second harmonic mixer unit 140 outputs an In-phase signal, and the third harmonic mixer unit 150 outputs a Quadrature-phase signal. The second harmonic mixer unit 140 includes a second harmonic mixer 142 and a first ½ divider 141. The third harmonic mixer unit 150 includes a third harmonic mixer 152 and a second ½ divider 151.

At first, the second harmonic mixer 142 of the second harmonic mixer unit 140 receives a signal having four phases and a frequency size equal to ⅓ of the output signal of the first harmonic mixer unit 130. The second harmonic mixer 142 outputs a signal having a frequency size equal to ⅙ of the input signal frequency. The second harmonic mixer 142 also requires four phases as input. The first ½ divider 141 generates the four phases.

That is, the first ½ divider 141 receives phases of 0° and 180° and divides them to four phases of 0°, 45°, 180°, and 225°. The phases output from the first ½ divider 141 input to the second harmonic mixer 142. The second harmonic mixer 142 receives the phases from the first ½ divider 141 and the signal from the first harmonic mixer 130 and outputs an In-phase signal.

The third harmonic mixer 152 of the third mixer unit 150 receives a signal having four phases and a frequency size equal to ⅓ of an output signal of the first harmonic mixer unit 130. The third harmonic mixer 152 outputs a signal having a frequency size equal to ⅙ of the input signal frequency. The third harmonic mixer 152 also requires four phases as an input. The second ½ divider 151 generates the four phases inputting to the third harmonic mixer 152.

That is, the ½ divider 151 receives phases of 90° and 270° as one input and divides the input into four phases of 90°, 135°, 270°, and 315°. Such divided phases input to the third harmonic mixer 152. The third harmonic mixer 152 receives phases from the second ½ divider 151 and a signal from the first harmonic mixer unit 130 and outputs a Quadrature-phase signal.

Finally, the receiver outputs an In-phase signal and a Quadrature-phase signal, which have phases of 0°, 90°, 180°, and 270°, 45°, 135°, 225°, and 315° and have a ⅙ frequency. A timing diagram of the first ½ divider 141 and the second ½ divider 142 will be described with reference to FIG. 8.

Figure 7:
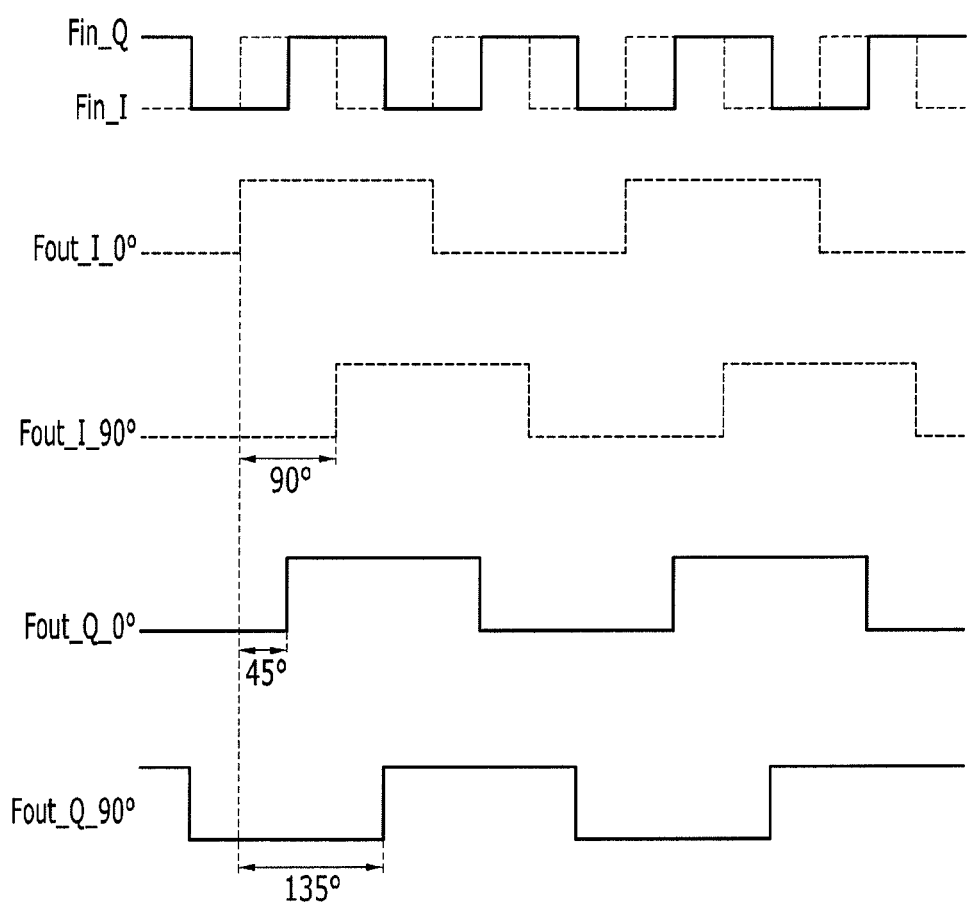
FIG. 7 is a timing diagram of a divider in accordance with an exemplary embodiment of the present invention.

FIG. 7 is a timing diagram of a divider in accordance with an exemplary embodiment of the present invention.

As shown in FIG. 7, a Quadrature-phase input signal (Fin_Q) inputting to the third harmonic mixer unit 150 and an In-phase input signal (Fin_I) inputting to the second harmonic mixer unit 140 have a phase difference of 45°. That is, the In-phase input signal (Fin_I) denotes ⅓ Fin 0° signal and the Quadrature-phase input signal (Fin_Q) denotes a ⅓ Fin 90° signal.

If such signals input to the first ½ divider 141 and the second ½ divider 151, an In-phase input signal is shown as Fout_I_0° and Fout_I_90° in FIG. 7 when the In-phase input signal is output. Accordingly, one input signal has a phase difference of 0° and 90° and a frequency size is converted to ⅙ of a frequency size of an original input signal.

Like the In-phase signal, the Quadrature-phase input signal is shown as Fout_Q_0° and F_out_Q_90° in FIG. 7. Accordingly, one input signal has a phase difference of 0° and 90° and a frequency size is converted to ⅙ of a frequency size of an original input signal.

Since the initial Quadrature-phase and In-phase input signals have a phase difference of 45°, a signal input as Fout_I_0 and Fout_I_90° is output while showing four phases of 0°, 45°, 90°, and 135°. In the same manner, a signal input as Fout_Q_180° and Fout_I_270° is output while showing four phases of 180°, 225°, 270°, and 315°. Finally, four input signals are converted to a ⅙ frequency size, and outputted as signals showing eight phases.

Meanwhile, a transmitter including a multi-stage harmonic mixer will be described with reference to FIG. 4.

Figure 4:
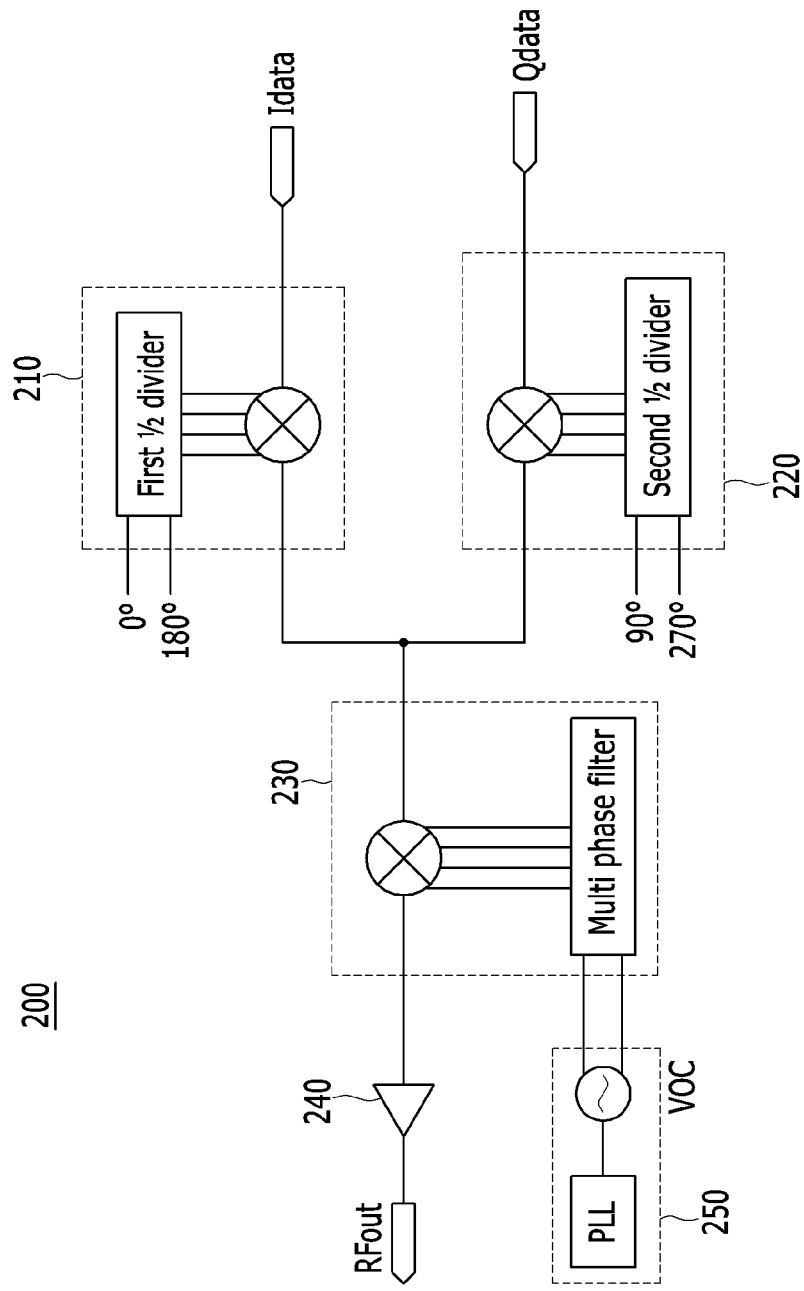
FIG. 4 is a configuration diagram that illustrates a transmitter including a multi-stage harmonic mixer in accordance with an exemplary embodiment of the present invention.

FIG. 4 is a configuration diagram that illustrates a transmitter including a multi-stage harmonic mixer in accordance with an exemplary embodiment of the present invention.

Figure 2:
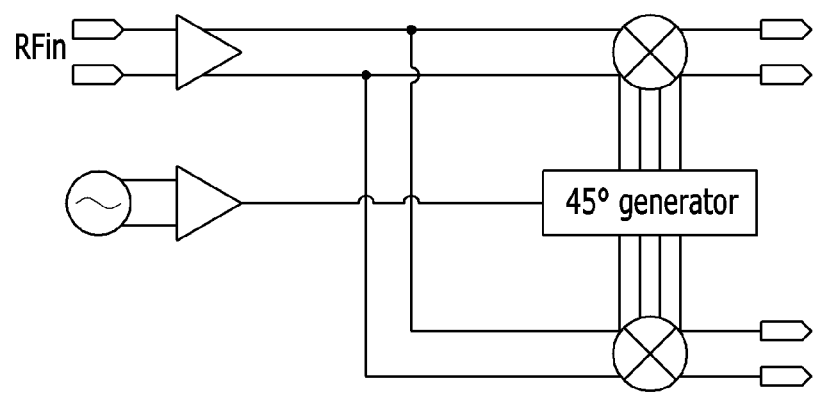
FIG. 2 is a configuration diagram that illustrates a receiver using a harmonic mixer.

Referring to FIG. 4, the transmitter in accordance with an exemplary embodiment of the present invention includes a first' harmonic mixer unit 210 and a second' harmonic mixer unit 220. On the contrary to the receiver of the FIG. 2, the first' harmonic mixer unit 210 receives an In-phase signal having a ⅙ frequency size and the second' harmonic mixer unit 220 receives a Quadrature-phase signal having a ⅙ frequency size. The first' harmonic mixer unit 210 and the second harmonic mixer unit 220 up-convert the received signals to signals having a frequency size two time greater than the input signals, for example, a frequency size equal to ⅓ of a frequency size of an original signal.

The up-converted signal inputs to the third' harmonic mixer unit 230. The third' harmonic mixer unit 230 up-converts the input signal to a signal having a frequency size third times greater than the input signal with a signal having four phases. For example, the third' harmonic mixer unit 230 outputs a signal having a frequency size same to that of an original signal. The amplifier 240 amplifies the up-converted signal from the third's harmonic mixer unit 230 and outputs as a transmission signal. The frequency generator 250 is identical to the frequency generator 120 of the receiver of FIG. 3. The phase generator 250 generates a plurality of phases based on the amplified signal from the amplifier 240. An inductor (not shown) resonates the plurality of generated phases from the phase generator and output the plurality of resonated phases While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A receiver, comprising:
a signal receiver configured to receive a first signal;
a frequency generator configured to synchronize a phase of the received first signal, convert a frequency size of the synchronized first signal to a first size, and output the converted signal as a second signal;
a first harmonic mixer unit configured to generate, based on the first signal and the second signal, a third signal having a frequency size converted to a second size, and output the third signal;
a second harmonic mixer unit configured to output, based on the third signal, an In-phase signal by using a signal having a frequency size converted to a third size; and
a third harmonic mixer unit configured to output, based on the third signal, a Quadrature-phase signal by using a signal having a frequency size converted to the third size,
wherein the first harmonic mixer unit includes
a multi-phase filter configured to output, based on the first signal, a plurality of phases, and
a first harmonic mixer configured to generate, based on the plurality of phases from the multi-phase filter and the first signal, the third signal and output the third signal.

2. The receiver of claim 1, wherein
the multi-phase filter includes:
an amplifier configured to receive the synchronized first signal and amplify the received first signal;
a phase generator configured to generate a plurality of phases based on the amplified first signal from the amplifier; and
an inductor configured to resonate the plurality of phases generated from the phase generator and output the plurality of resonated phases.

3. The receiver of claim 1, wherein
the second harmonic mixer unit includes:
a first divider configured to receive two different phases and divide the received two different phases to four phases; and
a second harmonic mixer configured to output, based on the four phases from the first divider and the third signal from the first harmonic mixer unit, the In-phase signal, and
the third harmonic mixer unit includes:
a second divider configured to receive two different phases and divide the received two different phases into four phases; and
a third harmonic mixer configured to output, based on the four phases from the second divider and the third signal from the first harmonic mixer unit, the Quadrature-phase signal.

4. The receiver of claim 3, wherein
the first divider is configured to receive a signal of phases of 0° and 180°, divide the received signal into phases of 0°, 45°, 180°, and 225°, and output the phases of 0°, 45°, 180°, and 225°, and
the second divider is configured to receive a signal of phases of 90° and 270°, divide the received signal into phases of 90°, 135°, 270°, and 315°, and output the phases of 90°, 135°, 270°, and 315°.

5. The receiver of claim 1, wherein the second size is ⅓ of the frequency size of an input signal, and the third size is ⅙ of the frequency size of the input signal.

6. A transmitter, comprising:
a first harmonic mixer unit configured to generate a first signal having a second frequency size by converting an In-phase signal having a first frequency size;
a second harmonic mixer unit configured to generate a second signal having the second frequency size by converting a Quadrature-phase signal having the first frequency size;
a third harmonic mixer unit configured to generate, based on the first and second signals, a third signal having the second frequency size; and
a signal transmitter configured to amplify and transmit the third signal,
wherein the first harmonic mixer unit includes
a first divider configured to receive two different phases and divide the two different phases to four phases, and
a first harmonic mixer configured to output, based on the four phases from the first divider and the In-phase signal, the first signal.

7. The transmitter of claim 6, wherein
the second harmonic mixer includes:
a second divider configured to receive two different phases and divide the two different phases into four phases; and
a second harmonic mixer configured to output, based on the four phases from the second divider and the Quadrature-phase signal, the second signal.

8. The transmitter of claim 6, wherein the third harmonic mixer unit includes:
an amplifier configured to receive and amplify a phase-synchronized signal;
a phase generator configured to generate a plurality of phases based on the amplified signal from the amplifier;
an inductor configured to resonate the plurality of generated phases from the phase generator and output the plurality of resonated phases; and
a third harmonic mixer configured to generate, based on the plurality of generated phases and the first signal and the second signal, the third signal, and output the third signal.

* * * * *